United States Patent
Banin et al.

(10) Patent No.: US 10,723,941 B2
(45) Date of Patent: Jul. 28, 2020

(54) SEEDED NANOPARTICLES

(71) Applicants: QLIGHT NANOTECH LTD., Jerusalem (IL); YISSUM RESEARCH DEVELOPMENT COMPANY OF THE HEBREW UNIVERSITY OF JERUSALEM, LTD., Jerusalem (IL)

(72) Inventors: Uri Banin, Jerusalem (IL); Itai Lieberman, Jerusalem (IL); Shany Neyshtadt, Heifa (IL); Lior Yedidya, Jerusalem (IL)

(73) Assignee: YISSUM RESEARCH DEVELOPMENT COMPANY OF THE HEBREW UNIVERSITY OF JERUSALEM, LTD., Jerusalem (IL)

( * ) Notice: Subject to any disclaimer, the term of this patent is extended or adjusted under 35 U.S.C. 154(b) by 0 days.

(21) Appl. No.: 15/576,912

(22) PCT Filed: May 24, 2016

(86) PCT No.: PCT/IL2016/050542
§ 371 (c)(1),
(2) Date: Nov. 27, 2017

(87) PCT Pub. No.: WO2016/189531
PCT Pub. Date: Dec. 1, 2016

(65) Prior Publication Data
US 2018/0148637 A1     May 31, 2018

Related U.S. Application Data

(60) Provisional application No. 62/167,552, filed on May 28, 2015.

(51) Int. Cl.
*C09K 11/02* (2006.01)
*H01L 33/50* (2010.01)
(Continued)

(52) U.S. Cl.
CPC .............. *C09K 11/02* (2013.01); *B82Y 30/00* (2013.01); *C09K 11/565* (2013.01); *C09K 11/883* (2013.01); *H01L 33/50* (2013.01)

(58) Field of Classification Search
CPC ..... C09K 11/02; C09K 11/565; C09K 11/883; B82Y 30/00; H01L 33/50
(Continued)

(56) References Cited

U.S. PATENT DOCUMENTS

| 9,957,442 B2 | 5/2018 | Banin et al. |
| 2013/0115455 A1* | 5/2013 | Banin .................. C09K 11/025 428/375 |

(Continued)

FOREIGN PATENT DOCUMENTS

| JP | 2013539798 A | 10/2013 |
| WO | 2012035535 A1 | 3/2012 |

(Continued)

OTHER PUBLICATIONS

International Search Report PCT/IL2016/050542 dated Sep. 8, 2016.
(Continued)

*Primary Examiner* — Alexandre F Ferre
(74) *Attorney, Agent, or Firm* — Millen White Zelano & Branigan, PC

(57) ABSTRACT

The present invention relates to a novel class of seeded nanoparticles and uses thereof.

24 Claims, 12 Drawing Sheets

(51) Int. Cl.
B82Y 30/00 (2011.01)
C09K 11/56 (2006.01)
C09K 11/88 (2006.01)

(58) Field of Classification Search
USPC .......................................................... 428/402
See application file for complete search history.

(56) References Cited

U.S. PATENT DOCUMENTS

2014/0312302 A1* 10/2014 Oron ...................... C09K 11/88
257/14
2016/0115027 A1* 4/2016 Banin .................... B82Y 10/00
428/402
2016/0230088 A1* 8/2016 Puetz ..................... C09K 11/02

FOREIGN PATENT DOCUMENTS

WO WO2012/035535 * 3/2012
WO 2015001557 A1 1/2015
WO WO2015/001557 * 1/2015

OTHER PUBLICATIONS

Hongbo Li et al: "Blue-UV-Emitting ZnSe(Dot)/ZnS(Rod) Core/Shell Nanocrystals Prepared from CdSe/CdS Nanocrystals by Sequential Cation Exchange", ACS Nano, vol. 6, No. 2, Feb. 28, 2012 (Feb. 28, 2012), US, pp. 1637-1647, XP055299023, ISSN: 1936-0851.
Banin, U. ei a/ ZnSe Quantum Dots Within CdS Nanorods: A Seeded-Growth Type-II System. Small 4, 1319-1323 (2008).
Carbone, L. et al Synthesis and Micrometer-Scale Assembly of Colloidal CdSe/CdS Nanorods Prepared by a Seeded Growth Approach. Nano Lett. 7, 2942-2950 (2007).
Bertoni, G. et al Direct Determination of Polarity, Faceting, and Core Location in Colloidal Core/Shell Wurtzite Semiconductor Nanocrystals. ACS Nano 6, 6453-6461 (2012).
She, C. et al Using Shape to Control Photoluminescence from CdSe/CdS Core/Shell Nanorods. J. Phys. Chem. Lett. 2, 1469-1475 (2011 ).
Banin, U. et al Multiexciton Engineering in Seeded Core/Shell Nanorods: Transfer from Type-I to Quasi-type-II Regimes. Nano Lett. 9, 3470-3476 (2009).
Banin, U. et al Highly Emissive Nano Rod-in-Rod Heterostructures with Strong Linear Polarization. Nano Lett. 11 , 2054-2060 (2011 ).
Deka, S. et al. CdSe/CdS/ZnS Double Shell Nanorods with High Photoluminescence Efficiency and Their Exploitation as Biolabeling Probes. J. Am. Chem. Soc. 131 , 2948-2958 (2009).
Boldt, K. et al Synthesis of Highly Luminescent and Photo-Stable, Graded Shell CdSe/CdxZn1-xS Nanoparticles by In Situ Alloying. Chem. Mater. 25, 4731-4738 (2013).
Li, L. et al Core/shell semiconductor nanocrystals. Small 5, 154-168 (2009).
Li, H. ef a/ Blue-UV-Emitting ZnSe(Dot)/ZnS(Rod) Core/Shell Nanocrystals Prepared from CdSe/CdS Nanocrystals by Sequential Cation Exchange. ACS Nano 6, 1637-1647 (2012).
Dorfs, D. et al Segmented CdSe@CdS/ZnS Nanorods Synthesized via a Partial Ion Exchange Sequence. Chem. Mater. 26, 3121-3127 (2014).
Alivisatos, A. P. et al Highly Luminescent Nanocrystals From Removal of Impurity Atoms Residual From Ion-Exchange Synthesis. Angew. Chemie W, 2437-2440 (2012).
Su, Ching-Hua et al., Optical characterization of bulk ZnSeTe solid solution,Journal of Applied Physics,2000, Nov. 1, vol. 88 No, 9,p.5148-5152.
Yu, Y.-M. et al.,Characterization and growth of ZnSTe epilayers by hot / wall epitaxy,Journal of Crystal Growth,2000, vol. 210,p. 521-526.
Notice of Reasons for Refusal in the corresponding JP application 2017-561888 dated Feb. 13, 2020 (pp. 1-10).

* cited by examiner

SEEDED NANOPARTICLES

TECHNOLOGICAL FIELD

The invention generally concerns a novel class of seeded nanoparticles and uses thereof.

BACKGROUND

Semiconductor quantum rods provide color tunable and polarized emission. As such, they are highly relevant building blocks for applications in flat panel displays in various approaches. These and other characteristics of the quantum rods, such as their wet chemical processing, and charge separation ability, also provide their relevance for additional applications exploiting fluorescence and other beneficial properties of the quantum rods. A particular architecture of interest is the seeded rod, where a seed, for example of a quantum dot of CdSe or ZnSe, is used to seed the growth of a rod [1-3]. The resultant dot-in-rod structure is often referred to as combining OD-1 D characteristics in one nanostructure.

The synthesis of semiconductor rods by seeded growth methodologies is based on a high temperature injection of cadmium chalcogenide quantum dot and sulfur precursor to a flask containing cadmium precursor and several ligands, including phosphines, phosphine oxides and phosphonic acids [2,4]. This yields highly monodisperse nanorods with controlled length and width. The combination of high band gap CdS nanorod with lower band gap CdSe seeds results in a type I or quasi type II band alignment and a significant fluorescence quantum yield [5,6].

The current synthesis, however, is so far limited to seeded CdS nanorods alone [1,7]. When an additional ZnS shell was grown over CdSe/CdS nanorod [8], the quantum yield of the nanorods increased somewhat but by a limited extent, exemplifying that variation in the rod composition could change and improve its properties. Such approaches also proved useful in more standard core/shell quantum nanoparticles compositions [9,10]. However, the aforementioned synthetic approach of the second overcoat on the seeded rods, used a combination of highly reactive chemicals with complex synthesis approach, and the resulting quantum yields and stability performance were also not maximal.

Therefore, there is an emerging need to expand this seeded rods architecture to other types of semiconductors, particularly to high band gap semiconductors or their multicomponent compounds. In particular, there is need to expand the seeded grown rods family also to Zn-chalcogenides containing rods materials, which have proven to be a challenge not addressed successfully yet, due to the synthetic difficulties. Successful addressing of this challenge can provide increased fluorescence quantum yields, increased stabilities to the seeded rods, along with further ability to tune the emission color for the desired application; in particular addressing shorter wavelength emission. The incorporation and growth of Zn-chalcogenide rods in seeded growth approach is also desirable from the viewpoint of reducing Cd content in the materials, as required by various environmental concerns.

In several works the composition of CdSe/CdS semiconductors was attempted to be modified using post synthesis cation exchange process [11-13]. Ability to replace $Cd^{+2}$ with $Cu^{+2}$, $Zn^{+2}$, $Pb^{+2}$ or $Ag^{+2}$ in the rod was demonstrated, resulting in a $Cu_2Se/Cu_2S$, ZnSe/ZnS, PbSe/PbS and $Ag_2Se/Ag_2S$ nanorods, respectively. The cation exchange was performed using a two-step process: first $Cd^{+2} \rightarrow Cu^{+2}$, followed by $Cu^{+2} \rightarrow Zn^{+2}$, $Pb^{+2}$ or $Ag^{+2}$. However, this approach has several limitations. This approach utilized additional processing steps which complicated the synthesis. The quantum yield of the nanorods produced has decreased rather than increased, and no versatility in the control of the nanorod composition has been shown.

In another work [12], partial cation exchange was achieved, resulting in a segmented CdSe/CdS/ZnS like-structure. This is also most likely related to the process approach, and hence the utility of such rods is of limited use for applications such as in displays requiring high quantum yield and stability.

Therefore, there remains the need to develop seeded nanorods with controlled composition, in particular nanorods with significant content of Zn chalcogenides, with controlled composition and enhanced properties.

BACKGROUND ART

[1] Banin, U. et al ZnSe Quantum Dots Within CdS Nanorods: A Seeded-Growth Type-II System. *Small* 4, 1319-1323 (2008).

[2] Carbone, L. et al Synthesis and Micrometer-Scale Assembly of Colloidal CdSe/CdS Nanorods Prepared by a Seeded Growth Approach. *Nano Lett.* 7, 2942-2950 (2007).

[3] US 2013/0115455

[4] Bertoni, G. et al Direct Determination of Polarity, Faceting, and Core Location in Colloidal Core/Shell Wurtzite Semiconductor Nanocrystals. *ACS Nano* 6, 6453-6461 (2012).

[5] She, C. et al Using Shape to Control Photoluminescence from CdSe/CdS Core/Shell Nanorods. *J. Phys. Chem. Lett.* 2, 1469-1475 (2011).

[6] Banin, U. et al Multiexciton Engineering in Seeded Core/Shell Nanorods: Transfer from Type-I to Quasi-type-II Regimes. *Nano Lett.* 9, 3470-3476 (2009).

[7] Banin, U. et al Highly Emissive Nano Rod-in-Rod Heterostructures with Strong Linear Polarization. *Nano Lett.* 11, 2054-2060 (2011).

[8] Deka, S. et al. CdSe/CdS/ZnS Double Shell Nanorods with High Photoluminescence Efficiency and Their Exploitation As Biolabeling Probes. *J. Am. Chem. Soc.* 131, 2948-2958 (2009).

[9] Boldt, K. et al Synthesis of Highly Luminescent and Photo-Stable, Graded Shell CdSe/CdxZn1-xS Nanoparticles by In Situ Alloying. *Chem. Mater.* 25, 4731-4738 (2013).

[10] Li, L. et al Core/shell semiconductor nanocrystals. *Small* 5, 154-168 (2009).

[11] Li, H. et al Blue-UV-Emitting ZnSe(Dot)/ZnS(Rod) Core/Shell Nanocrystals Prepared from CdSe/CdS Nanocrystals by Sequential Cation Exchange. *ACS Nano* 6, 1637-1647 (2012).

[12] Dorfs, D. et al Segmented CdSe@CdS/ZnS Nanorods Synthesized via a Partial Ion Exchange Sequence. *Chem. Mater.* 26, 3121-3127 (2014).

[13] Alivisatos, A. P. et al Highly Luminescent Nanocrystals From Removal of Impurity Atoms Residual From Ion-Exchange Synthesis. *Angew. Chemie* 124, 2437-2440 (2012).

SUMMARY OF THE INVENTION

Herein, the inventors provide a novel synthetic methodology for growing seeded rods, a methodology that is simple, reproducible and which provides a highly tunable Zn-chalcogenide seeded rod nanoparticles and compositions containing same. Thus, the invention provides a novel class of seeded nanorods (SR) with significant controlled Zn-chalcogenides content in the rods architecture. Further provided is a new one-pot synthetic approach for the formation of this new novel class of nanorods.

As will be evident from the disclosure herein, the SRs of the invention are not core-shell structures. It is crucial to note that the SR material is a mixed-dimensionality heterostructure with unique properties having a complete quantum structure and not a simple sum of properties of apparent separate components of the seed and nanorod. The SRs of the invention being anisotropic materials cannot be considered as core/shell structures, which by definition are isotropic. Furthermore, the rod cannot be considered "a coating" of the seed, but rather provides the bulk of the structure where the seed is present (seeded) therein.

Further differences of the SRs of the invention with core-shell structures have to do with their properties stemming from this unique architecture: First, emission of polarized light which is observable only in the materials of the invention and not in core-shell structures. As shown below, the SRs of the invention emit polarized light while the seeds of the SRs do not emit polarized light; this being contrary to core/shell nanocrystals that do not display polarized emission.

Further, a very large emission stokes-shift was observed in the SRs of the invention and not in the corresponding core/shell nanostructures.

Similarly, under electric field, emission modulation was observed. The response under electric field leads the SRs of the invention to exhibit a switching effect that is not observed in core/shell nanocrystals.

It is evident that the SRs of the invention provide a platform for preparing a tunable composition which is achievable in a significant and a well controlled manner. Using the proper seed for rod growth along with, for example, a proper content of sulfur, and in the presence of Zn-containing precursors, Zn is allowed to incorporate into the backbone of the nanorods, while using the unique methodology of the invention.

Thus, the invention provides seeded nanorods with Zn-chalcogenide content in the nanorods, characterized by significantly improved properties in terms of fluorescence quantum yield, stability and color tuning control.

In one aspect, there is provided a zinc-chalcogenide seeded nanorod, comprising a zinc-chalcogenide rod nanostructure embedding a seed nanostructure of a different material.

In some embodiments, the zinc-chalcogenide rod structure is of a material selected from zinc-chalcogenide alloy, e.g., with cadmium-chalcogenide.

In some embodiments, the zinc-chalcogenide seeded nanorods, comprise each a zinc-chalcogenide rod nanostructure embedding a seed nanostructure of a different material, having zinc-oleate on the nanorod surface.

In another aspect, the invention contemplates a new method for growing zinc-chalcogenide seeded rods, a method which utilizes the addition of a zinc precursor to a cation reactive precursor, to permit final seeded rod architecture. This method allows, for the first time, to obtain seeded alloyed nanorods, with a controlled composition and significant content of Zn-chalcogenide in the rods and with improved characteristics.

As used herein, the seeded rod (SR) of the invention is a nanostructure comprising a Zn-chalcogenide containing elongated structure (rod-like in structure), embedding a seed structure. In other words, the SR of the invention may be considered a seed structure within a rod structure, exhibiting controlled composition of a Zn-chalcogenide material and/or Zn-chalcogenide with Cd-chalcogenide alloyed rod composition. The SR of the invention is not a core/shell structure, as characterized above.

In some embodiments, the rod consists a Zn-chalcogenide material.

In some embodiments, the Zn-chalcogenide rod comprises a Zn-chalcogenide material and at least one other material. In further embodiments, the rod comprising a combination of a Zn-chalcogenide material and at least one other material are homogenously distributed within the rod. In other embodiments, the concentration of the Zn-chalcogenide material is increased with increasing distance from the seed structure. In other words, the concentration of the Zn-chalcogenide is highest at regions of the rod material further away from the seed.

In some embodiments, the SR of the invention comprises a seed structure and a Zn-chalcogenide rod of a material of the general formula $Cd_xZn_{1-x}Se_yS_{1-y}$, wherein x ranges between 0 (zero) and 1, and wherein y ranges from 0 (zero) and 1. In some embodiments, x=0. In other embodiments, x is between 0.5 and 0.9.

In some embodiments, the SR of the invention comprises a seed structure and a Zn-chalcogenide rod of a material of the general formula $Cd_xZn_{1-x}Te_yS_{1-y}$, wherein x ranges between 0 (zero) and 1, and wherein y ranges from 0 (zero) and 1. In some embodiments, x=0. In other embodiments, x is between 0.5 and 0.9.

In some embodiments, the SR of the invention comprises a seed structure and a Zn-chalcogenide rod of a material of the general formula $Cd_xZn_{1-x}Te_zSe_yS_{1-y-z}$, wherein x ranges between 0 (zero) and 1, wherein y ranges from 0 (zero) and 1, and wherein z ranges from 0 (zero) and 1. In some embodiments, x=0. In other embodiments, x is between 0.5 and 0.9.

The SRs of the invention are typically between about 5 nm and 150 nm in length and between about 2 and 15 nm in width (diameter). The SRs may have an aspect ratio (length/diameter) between 1.8 and 20. In some embodiments, the aspect ratio is larger than 1.8. In further embodiments, the aspect ratio is larger than 2. In further embodiments, the aspect ratio is larger than 3 and in further embodiments, the aspect ratio is larger than 10.

In some embodiments, the seed structure and the SR system as a whole may be spherical or non-spherical in shape, with the seed structure being positioned concentrically or non-concentrically in the structure in which it is embedded.

In some embodiments, the seed structure and the SR system is non-spherical. In some embodiments, the seed is spherical.

The seed material is typically a semiconductor material.

As stated above, the rod structure may, in some embodiments, consist of a zinc-chalcogenide material; and in other embodiments it may be in the form of an alloy with at least one other material.

In such embodiments, the at least one other material may be selected amongst metals, metal alloys, metal oxides, insulators, and semiconducting materials.

In some embodiments, the at least one other material is or comprises an element of Groups IIIB, IVB, VB, VIB, VIIB, VIIIB, IB, IIB, IIIA, IVA and VA of block d of the Periodic Table of the Elements.

In some embodiments, the at least one other material is or comprises a transition metal selected from Groups IIIB, IVB, VB, VIB, VIIB, VIIIB, IB and IIB of block d the Periodic Table. In some embodiments, the transition metal is a metal selected from Sc, Ti, V, Cr, Mn, Fe, Ni, Cu, Y, Zr, Nb, Tc, Ru, Mo, Rh, W, Au, Pt, Pd, Ag, Mn, Co, Cd, Hf, Ta, Re, Os, Ir and Hg.

In some embodiments, the seed material and the at least one other material, independently of each other, is a semiconductor material selected from elements of Group I-VII, Group II-VI, Group III-V, Group IV-VI, Group III-VI, and Group IV semiconductors and combinations thereof.

In other embodiments, the semiconductor material is a Group I-VII semiconductors are CuCl, CuBr, CuI, AgCl, AgBr, AgI and the like.

In other embodiments, the semiconductor material is a Group II-VI material being selected from CdSe, CdS, CdTe, HgS, HgSe, HgTe, CdSeTe and any combination thereof. Or from ZnSe, ZnTe, ZnS, ZnCdSe, ZnCdTe, ZnCdS and any combination thereof.

In further embodiments, Group III-V material are selected from InAs, InP, InN, GaN, InSb, InAsP, InGaAs, GaAs, GaP, GaSb, AlP, AlN, AlAs, AlSb, and any combination thereof.

In additional embodiments, the semiconductor material is selected from Group IV-VI, the material being selected from PbSe, PbTe, PbS, PbSnTe, Tl2SnTe5 and any combination thereof.

In some embodiments, the SR of the invention consists a seed of a material selected from ZnTe, ZnSe, ZnTe, ZnSeTe, InAs, InP, CdSe, CdS and CdSSe, embedded in a Zn-chalcogenide rod material selected from ZnS, ZnTe and ZnTe/ZnS.

In some embodiments, the SR of the invention consists a seed of a material selected from ZnTe, ZnSe, ZnTe, ZnSeTe, InAs, InP, CdSe, CdS and CdSSe, the seed being embedded in a Zn-chalcogenide rod of a material selected from ZnS, ZnTe and ZnTe/ZnS, and wherein the at least one other material is selected from CdSe and CdS.

The invention further provides cadmium free Zn-chalcogenide SR.

The invention further provides a SR selected from CdSe/Cd$_x$Zn$_{1-x}$S, wherein x is between 0 and 1 (or between 0 and 0.9 or between 0 and 0.95); CdSe/ZnS; CdSe/CdZnS; ZnSe/Cd$_x$Zn$_{1-x}$S, wherein x is between 0 and 1 (or between 0 and 0.9 or between 0 and 0.95); InP@ZnSe/Cd$_x$Zn$_{1-x}$S, wherein x is between 0 and 1 (or between 0 and 0.9 or between 0 and 0.95); CdSe/Cd$_x$Zn$_{1-x}$Se$_y$S$_{1-y}$, wherein x is between 0 and 1 (or between 0 and 0.9 or between 0 and 0.95) and wherein y is between 0 and 1 (or between 0 and 0.9 or between 0 and 0.95); CdS/Cd$_x$Zn$_{1-x}$S, wherein x is between 0 and 1 (or between 0 and 0.9 or between 0 and 0.95); CdS/Cd$_x$Zn$_{1-x}$Se, wherein x is between 0 and 1 (or between 0 and 0.9 or between 0 and 0.95); ZnS/Cd$_x$Zn$_{1-x}$S, wherein x is between 0 and 1 (or between 0 and 0.9 or between 0 and 0.95); ZnS/Cd$_x$Zn$_{1-x}$Se, wherein x is between 0 and 1 (or between 0 and 0.9 or between 0 and 0.95); InP@ZnS/Cd$_x$Zn$_{1-x}$S, wherein x is between 0 and 1 (or between 0 and 0.9 or between 0 and 0.95); InP@ZnS/Cd$_x$Zn$_{1-x}$Se, wherein x is between 0 and 1 (or between 0 and 0.9 or between 0 and 0.95); InP@ZnSe/Cd$_x$Zn$_{1-x}$Se, wherein x is between 0 and 1 (or between 0 and 0.9 or between 0 and 0.95); CdS/Cd$_x$Zn$_{1-x}$Se$_y$S$_{1-y}$, wherein x is between 0 and 1 (or between 0 and 0.9 or between 0 and 0.95) and wherein y is between 0 and 1 (or between 0 and 0.9 or between 0 and 0.95); InP@ZnSe/Cd$_x$Te$_{1-x}$S, wherein x is between 0 and 1 (or between 0 and 0.9 or between 0 and 0.95); CdSe/Cd$_x$Te$_{1-x}$Se$_y$S$_{1-y}$, wherein x is between 0 and 1 (or between 0 and 0.9 or between 0 and 0.95) and wherein y is between 0 and 1 (or between 0 and 0.9 or between 0 and 0.95); CdS/Cd$_x$Te$_{1-x}$S, wherein x is between 0 and 1 (or between 0 and 0.9 or between 0 and 0.95); CdS/Cd$_x$Te$_{1-x}$Se, wherein x is between 0 and 1 (or between 0 and 0.9 or between 0 and 0.95); ZnS/Cd$_x$Te$_{1-x}$S, wherein x is between 0 and 1 (or between 0 and 0.9 or between 0 and 0.95); ZnS/Cd$_x$Te$_{1-x}$Se, wherein x is between 0 and 1 (or between 0 and 0.9 or between 0 and 0.95); InP@ZnS/Cd$_x$Te$_{1-x}$S, wherein x is between 0 and 1 (or between 0 and 0.9 or between 0 and 0.95); InP@ZnS/Cd$_x$Te$_{1-x}$Se, wherein x is between 0 and 1 (or between 0 and 0.9 or between 0 and 0.95); InP@ZnSe/Cd$_x$Te$_{1-x}$Se, wherein x is between 0 and 1 (or between 0 and 0.9 or between 0 and 0.95); CdS/Cd$_x$Te$_{1-x}$Se$_y$S$_{1-y}$, wherein x is between 0 and 1 (or between 0 and 0.9 or between 0 and 0.95) and wherein y is between 0 and 1 (or between 0 and 0.9 or between 0 and 0.95).

The invention further provides SR systems selected from systems listed in

TABLE 1

| Seeded Rod | Seed | Elongated structure (Rod) | Ranges |
|---|---|---|---|
| CdSe/Cd$_x$Zn$_{1-x}$S | CdSe | Cd$_x$Zn$_{1-x}$S | $0 \leq x < 1$ |
| CdSe$_y$S$_{1-y}$/Cd$_x$Zn$_{1-x}$S | CdSe$_y$S$_{1-y}$ | Cd$_x$Zn$_{1-x}$S | $0 \leq x < 1$, $0 \leq y < 1$ |
| CdSe/Cd$_x$Zn$_{1-x}$S$_z$Se$_{1-z}$ | CdSe | Cd$_x$Zn$_{1-x}$S$_z$Se$_{1-z}$ | $0 \leq x < 1$, $0 \leq z < 1$ |
| CdSe$_y$S$_{1-y}$/Cd$_x$Zn$_{1-x}$S$_z$Se$_{1-z}$ | CdSe$_y$S$_{1-y}$ | Cd$_x$Zn$_{1-x}$S$_z$Se$_{1-z}$ | $0 \leq x < 1$, $0 \leq y < 1$, $0 \leq z < 1$ |
| InP/ZnSe/Cd$_x$Zn$_{1-x}$S | InP/ZnSe | Cd$_x$Zn$_{1-x}$S | $0 \leq x < 1$ |
| InP/ZnSe/Cd$_x$Zn$_{1-x}$SzSe1 − z | InP/ZnSe | Cd$_x$Zn$_{1-x}$S$_z$Se$_{1-z}$ | $0 \leq x < 1$, $0 \leq z < 1$ |
| ZnSe/Cd$_x$Zn$_{1-x}$S | ZnSe | Cd$_x$Zn$_{1-x}$S | $0 \leq x < 1$ |
| ZnSe/Cd$_x$Zn$_{1-x}$S$_z$Se$_{1-z}$ | ZnSe | Cd$_x$Zn$_{1-x}$S$_z$Se$_{1-z}$ | $0 \leq x < 1$, $0 \leq z < 1$ |

Table 1:

SR systems according to the invention. Each of the listed systems, independently of the other, or in combination with any one or more of the other listed SR systems of the invention, may be in some embodiments a preferred SR system of the invention.

The SR of the invention are said to comprise a seed structure and a rod structure embedding the seed. The rod and the seed are of different material constitutions.

The rod material is typically a zinc-chalcogenide based material, namely it comprises a zinc-chalcogenide material and at least one other material, which in some embodiments, is a semiconductor material. In some embodiments, the alloyed rod material is of a zinc-chalcogenide and a cadmium chalcogenide. In such embodiments, the amount of the zinc-chalcogenide in the rod may be varied from 0.01% to 99.99%, with the other material, e.g., cadmium chalcogenide amount varying from 99.99% to 0.01%, respectively.

In some embodiments, the zinc-chalcogenide may be homogenously distributed along with the e.g., cadmium chalcogenide or an amount of the zinc-chalcogenide may be separately form a material layer on the cadmium chalcogenide material.

In some embodiments, the zinc-chalcogenide material is graded within the e.g., cadmium chalcogenide rod, in such a way that the amount (concentration) of the zinc-chalcogenide material increases away from the seed structure (or decreases towards the position of the seed structure); or vice versa, the amount of the zinc-chalcogenide decreases away from the seed structure (or increases towards the position of the seed structure).

The unique SR systems of the invention and the ability to control the zinc-chalcogenide amount and distribution in the rod becomes possible by a novel processes developed for this purpose. While the process of the invention permits growth of SR such as those exemplified herein, namely zinc-chalcogenide systems, the process may similarly be useful for growing other SR systems.

Thus, in another aspect of the invention, there is provided a process for the manufacture of a SR system, the SR system comprising a Zn-chalcogenide structure, e.g., rod structure, embedding a seed structure, the process comprising treating a medium containing seed nanocrystals with (1) a chalcogenide precursor and a metal atom containing precursor under conditions initiating formation of a metal-chalcogenide nanorod around the seed nanocrystals; and (2) at least one zinc atom containing precursor to thereby to thereby afford a SR of the formula seed/metal$_x$Zn$_{1-x}$chalcogenide$_y$, wherein the seed is selected as disclosed herein, the metal is in some embodiments Cd, the chalcogenide is selected from Te, S and Se, and each of x and y independently is between 0 and 1 (or between 0 and 0.9 or between 0 and 0.95).

In some embodiments, the process comprises adding to a medium containing seed nanocrystals a chalcogenide precursor and a metal precursor under conditions initiating formation of a metal-chalcogenide nanorod around the seed nanocrystals; and subsequently adding at least one zinc precursor.

The addition of the metal precursor and the zinc precursor may be simultaneous or step-wise, wherein the zinc precursor is added after the metal precursor is added and a metal chalcogenide rod begins to form around the seed structure.

In some embodiments, the zinc precursor is added in full or in small batches, while the progress of SR development is monitored. In some embodiments, the consumption of the metal precursor and formation of the metal chalcogenide rod is monitored and the addition of the zinc precursor takes places as long as the metal chalcogenide rod is formed.

In some embodiments, the zinc precursor is added after 1, 2, 3, 4, 5, 6, 7, 8, 9, or 10, or 15, or 20, or 25, or 30, or 35, or 40, or 45, or 50, or 55, or 60, or 65, or 70, or 75, or 80, or 85, or 90% of the metal precursor reacts to form the metal chalcogenide rod around the seed structure.

In further embodiments, the zinc precursor is added after 10, 20, 30, 40, 50, or 60 seconds after the addition of the metal precursor or 1, 2, 3, 4, 5, 6, 7, 8, 9, 10, 11, 12, 13, 14 or 15 minutes thereafter.

In some embodiments, the metal chalcogenide, e.g., Cd-chalcogenide, rod formation is carried out at a temperature between 100 and 380° C. In some embodiments, the temperature is between 200 and 370, between 200 and 360, between 200 and 350, between 200 and 340, between 200 and 330, between 200 and 320, between 200 and 310, between 200 and 300, between 200 and 290, between 200 and 280, between 200 and 270, between 200 and 260, between 200 and 250, between 200 and 240, between 200 and 230, between 200 and 220 or between 200 and 210° C.

In some embodiments, the metal chalcogenide, e.g., Cd-chalcogenide, rod formation is carried out between 300 and 380° C. In some embodiments, the temperature is between 300 and 370, between 300 and 360, between 300 and 350, between 300 and 340, between 300 and 330, between 300 and 320 or between 300 and 310° C.

In some embodiments, the metal chalcogenide, e.g., Cd-chalcogenide, rod formation is carried out between 320 and 380° C. In some embodiments, the temperature is between 320 and 370, between 320 and 360, between 320 and 350, between 320 and 340 or between 320 and 330° C.

In some embodiments, independently of the temperature under which the metal chalcogenide rod is formed, the zinc precursor is added to the medium at a medium temperature between 200 and 380° C. In some embodiments, the medium temperature is between 200 and 370, between 200 and 360, between 200 and 350, between 200 and 340, between 200 and 330, between 200 and 320, between 200 and 310, between 200 and 300, between 200 and 290, between 200 and 280, between 200 and 270, between 200 and 260, between 200 and 250, between 200 and 240, between 200 and 230, between 200 and 220 or between 200 and 210° C.

In some embodiments, the zinc precursor is added at a temperature between 300 and 380° C. In some embodiments, the temperature is between 300 and 370, between 300 and 360, between 300 and 350, between 300 and 340, between 300 and 330, between 300 and 320 or between 300 and 310° C.

In some embodiments, the zinc precursor is added at a temperature between 320 and 380° C. In some embodiments, the temperature is between 320 and 370, between 320 and 360, between 320 and 350, between 320 and 340 or between 320 and 330° C.

The process of the invention, according to some embodiments, consists the steps of preparing the seed nanocrystals and permitting nanorod growth. In some embodiments, the seed nanocrystal is a CdSe seed, synthesized by suitable precursors of Cd and Se, e.g., in high boiling solvents and in the presence of a ligand selected from TOPO (trioctylphosphine oxide), TOP (trioctylphosphine) and ODPA (octadecylphosphonic acid). In some other embodiments, the seed nanocrystal is a CdSeS seed synthesized by suitable precursors of Cd, Se and S, e.g., in high boiling solvents and in the presence of a ligand selected from TOPO (trioctylphosphine oxide), TOP (trioctylphosphine) and ODPA (octadecylphosphonic acid).

In some embodiments, the nanocrystals are prepared by reacting a metal atom containing precursor, e.g., Cd precursor, TOP (trioctylphosphine), TOPO (trioctylphsphineoxide) and ODPA (ocatdecylphosphonic acid) or other phosphonic acids, at high temperatures, e.g., at possible temperatures ranging between 200–380° C. with a chalcogenide precursor, e.g., Se-TOP, which is swiftly injected into the metal-containing medium.

Within tens of seconds of nucleation and growth, the reaction is quenched by rapid cooling and in some embodiments by addition of room temperature TOP to the flask. The CdSe or CdSeS seed nanocrystals are cleaned from the excess precursors, ligands and solvents by solvent/non-solvent precipitation and centrifugation.

The anisotropic seeded nanorod nanostructure is subsequently prepared by a seeded growth approach according to which, in some embodiments, a growth solution consisting of a metal precursor, e.g., Cd precursor, TOP, ODPA, TOPO, and HPA (hexadecylphosphonic acid) is heated to temperatures ranging between 200-380° C. An initiation solution consisting of seed nanocrystals, sulfur, as the chalcogenide atom, and TOP is swiftly injected into the flask containing the growth solution.

The temperature in which the process is carried out after the injection in some embodiments ranges between 200-380° C., after the injection. Typical times are several to tens of minutes to hours.

Once the desired product is achieved, the reaction is quenched by cooling the reaction flask.

The SR systems of the invention are anisotropic seeded nanorod heterostructures having in some embodiments hexagonal (wurtzite) crystalline structure within which is present a small region of lower band gap semiconductor material (the seed). This heterostructure may be characterized as having a mixed dimensionality of 0D-1 D characteristic.

Without wishing to be bound by theory, the anisotropic growth of the SR via a seeded growth using, e.g., a CdSe spherical seed nanocrystal with hexagonal crystal structure is characterized by an anisotropic rapid growth along the C-axis (or the 001 axis) of the hexagonal crystal structure. The growth along different opposing facets takes place at different rates such that the location of the lower band gap semiconductor material is closer to one end of the anisotropic seeded nanorod, typically ¼ to ⅓ closer to one end.

The invention also provides a device incorporating at least one SR according to the invention. In some embodiments, the device is selected from a light conversion layer, a back light unit of a flat panel display, a laser, an optical switch, an optical fiber, a gain device, an amplifier, a display device, a detector, a communication system, a light emitting diode, a solar cell, a fluorescence marker, a biological fluorescence marker, and a sensor. A light emitting diode comprising a SR according to the present invention.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which.

DETAILED DESCRIPTION OF EMBODIMENTS

This work provides new seeded semiconductor nanorods with a tunable composition containing Zn-chalcogenides in the rods in significant and well controlled manner. Using the proper seed for rod growth along with proper content of sulfur for example, an additional Zn containing precursors is added in order to incorporate it into the nanorods. Therefore, in one embodiment, the product seeded rods with Zn-chalcogenides content in the rods is a novel structure with significantly improved properties in terms of fluorescence quantum yield, stability and color tuning control.

The invention further provides a method that allows, for the first time, to obtain seeded alloyed nanorods, with a controlled composition and significant content of Zn-chalcogenide in the rods and with improved characteristics.

DETAILED DESCRIPTION—EXAMPLES

Example 1—$CdSe/Cd_xZn_{1-x}S$ Nanorod

Figure 1:
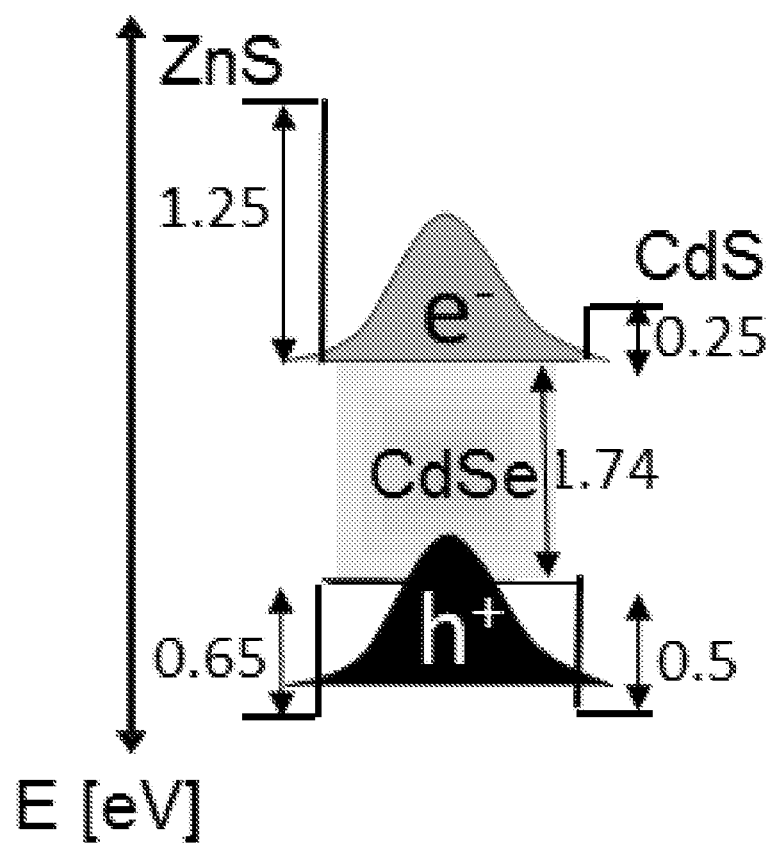
FIG. 1 depicts band alignment of CdSe, CdS and ZnS (bulk values).

CdSe seeds and S-precursor (S-TOP) were injected into a flask containing Cd precursor, phosphonic acid and TOP/TOPO. A reactive Zn precursor is slowly added to the synthesis, in the initial stages of the growth. Relative band alignment of CdSe, ZnS and CdS semiconductors that is depicted in FIG. 1, demonstrating the more pronounced type I configuration in CdSe/ZnS compared to CdSe/CdS nanorods. Taking into account the lattice mismatch between these materials, one expects an increased quantum yield in $CdSe/Cd_xZn_{1-x}S$ nanorod structure. This structure is obtained via an initial reaction of seeds with CdS suitable precursors, followed by (and in some case along with) slow rate additions of zinc precursor to form an alloyed shell, with proper additions and temperature control of the synthesis.

Example 1A—$CdSe/Cd_xZn_{1-x}S$ Nanorod with Small Seeds (2 nm)

$6.1 \times 10^{-4}$ mole CdO, Hexylphosphonic acid (HPA) and octadecylphosphonic (ODPA) in a 2.5:1 ratio to CdO were added to a 3 neck flask containing trioctylphosphine oxide (TOPO) and evacuated at 150° C. The flask was heated under Argon to 300° C. Then, trioctylphosphine (TOP) was added to the flask. Afterwards, the temperature in the flask was raised to 380° C., where the solution of small CdSe seeds (approx. 2 nm) in Sulfur-TOP were swiftly injected into the flask. 6 ml of Zn oleate were added to the flask during the first 10 min of the synthesis. The reaction was terminated after 1 hour, cooled down to room temperature and its content stored under argon.

Figure 2A:
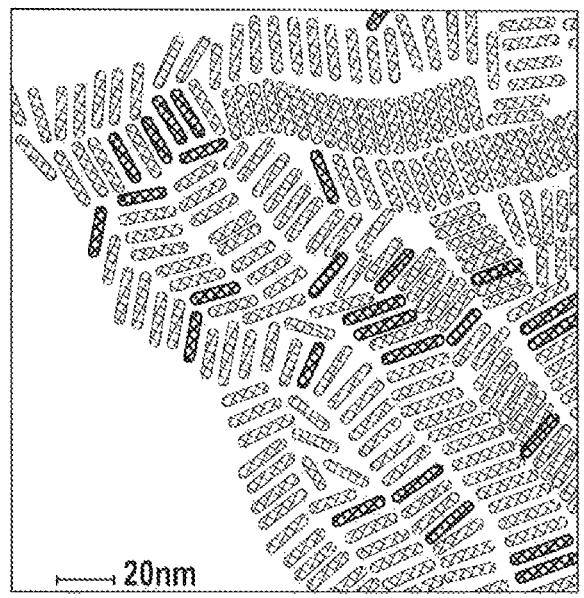
FIGS. 2A-B: Transmission electron microscopy (TEM) of (FIG. 2A) CdSe/CdS nanorods and (FIG. 2B) of CdSe/Cd(Zn)S nanorods.
Figure 2B:
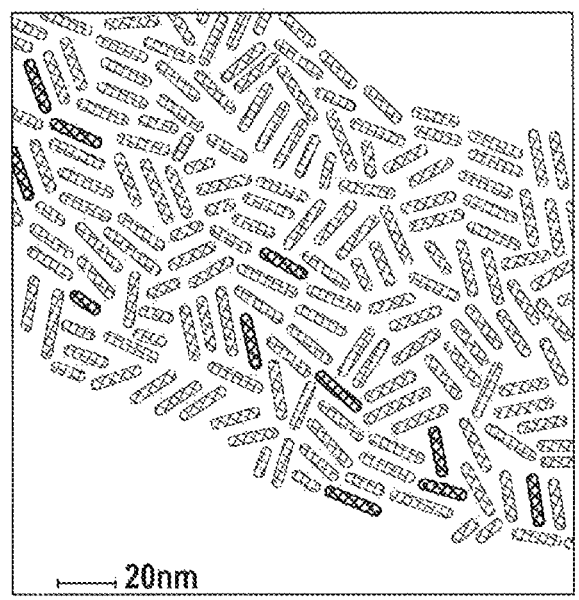
Figure 3A:
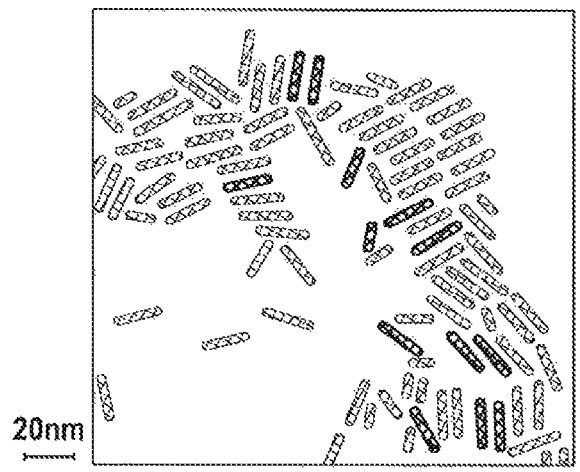
FIGS. 3A-C: TEM images of CdSe/Cd(Z)nS prepared using Zn:Cd ratio in the reaction of 4:1 (FIG. 3A), 8:1 (FIG. 3B) and 16:1 (FIG. 3C).
Figure 3B:
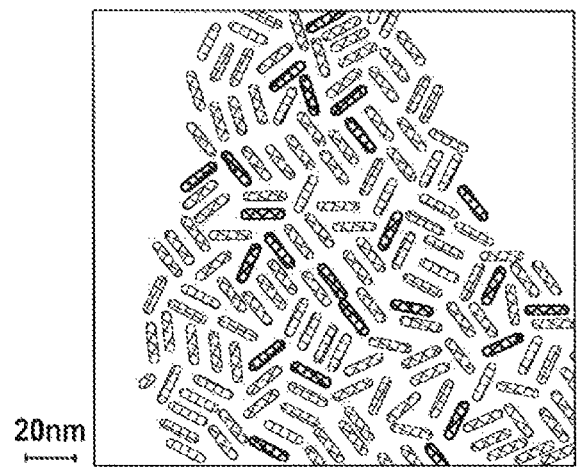
Figure 3C:
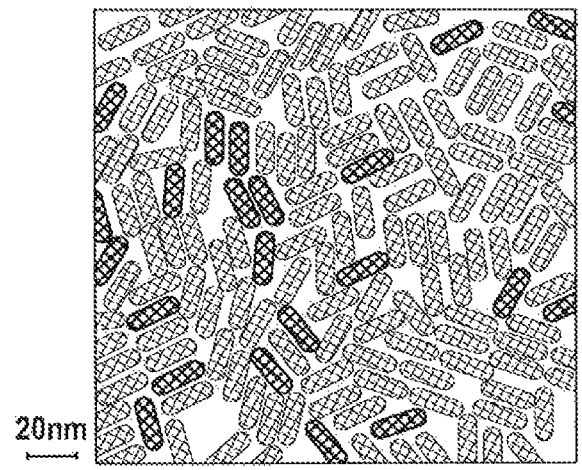

In this synthesis, small CdSe seeds—approx. 2 nm, were injected, resulting in green emitting NR's. The resultant nanoparticles possess a rod structure, with a good size distribution as could be seen in the TEM images, FIG. 2B, when compared to the NR's synthesized without Zn addition—FIG. 2A. The length of the green emitting nanorods is 20 nm in this example, and it could be easily tuned by changing the reaction conditions. The width of the nanorods varies between 4 and 7 nm, and could be tuned by changing the reaction conditions—by the Zn/Cd ratio and concentration of the reactants in the flask, along with reaction temperature and time. FIG. 3 shows TEM images of 3 samples of NR's prepared with Zn:Cd ratios in the reaction of 4:1, 8:1 and 16:1, in FIGS. 3A, B and C, respectively. While the length of the NR's is similar (~20 nm), the different ratios and conditions yield widths of 5, 5.5 and 6.5 nm, for 4:1, 8:1 and 16:1 Zn:Cd ratios, respectively. This is already a direct evidence for the incorporation of the Zn-chalcogenides into the rods by our approach.

Further optical and structural characterization of the formed nanorods indicates directly that CdZnS alloy is formed during the synthesis.

Zn content in the nanorods is examined using inductively coupled plasma atomic emission spectroscopy (ICP-AES). The obtained nanorods were washed, in order to get rid of excess ligands and precursors and then reacted with highly reactive acid mixture, causing decomposition of the nanorods into free positive and negative ions. This mixture was diluted in DDW (double distilled water) and measured with ICP-AES compared to standard $Cd^{+2}$ and $Zn^{+2}$ ion solutions. The results of such measurements are presented in Table 2, showing a gradual controlled increase in the Zn content of the NR's, as a function of a change in the Zn/Cd ratio in the synthesis.

TABLE 2

Summary of Zn/Cd ratios obtained from ICP analysis of NR's prepared with different Zn/Cd ratios in the synthesis.
Zn/Cd ratio

| In the synthesis | According to ICP |
|---|---|
| 4 | 1.5 |
| 8 | 4 |
| 16 | 8 |

Figure 4:
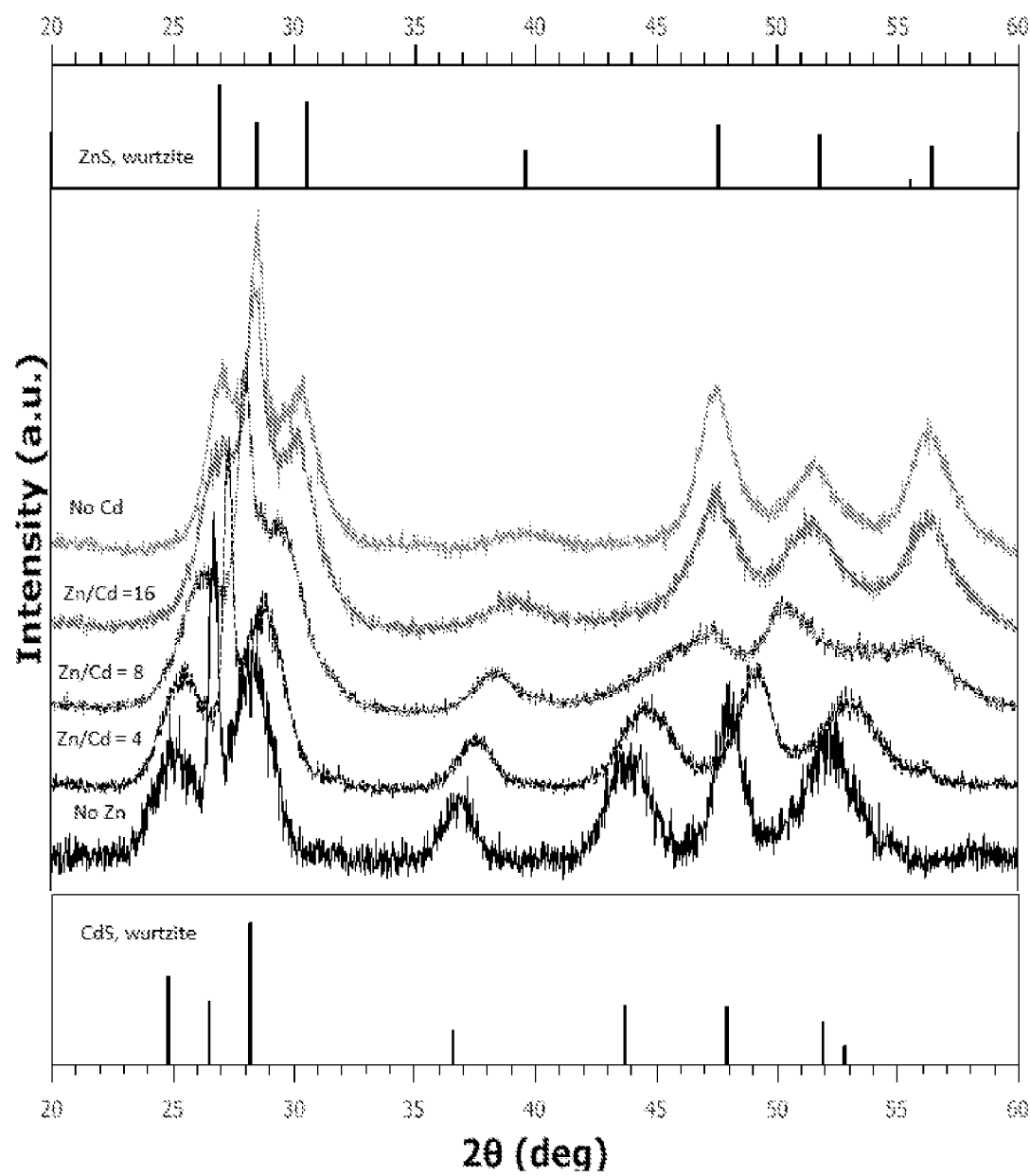
FIG. 4: XRD of nanorods prepared without Zn addition and with Zn addition. The literature XRD spectrum for CdS, $Cd_{0.5}Zn_{0.5}S$ and ZnS are plotted below.

The crystalline structure of the formed nanorods was examined also using X-ray diffraction. The diffraction patterns of the CdSe/CdS nanorods prepared with and without Zn addition are shown in FIG. 4. The diffraction pattern of CdSe/CdS nanorods (black line) exhibits similarity to the known pattern of CdS with a wurtzite structure (bottom panel). Peaks of CdSe are not resolved separately, due to the small volume fraction of CdSe in the nanorod, and the small size. The diffraction patterns of nanorods prepared with Zn addition are shifted to larger 2θ angles (smaller d-spacing), as could be seen in the grey lines in FIG. 3. The gradual shift with increasing Zn/Cd ratio in the synthesis towards the known pattern of wurtzite ZnS (top panel), correlates well with the results obtained from ICP analysis of these samples, showing increase in Zn content of the samples as a function of Zn/Cd ratio in the synthesis. Furthermore, the results obtained from XRD point out towards an alloyed structure rather than ZnS shell over CdS, demonstrating the ability to tune the composition of these nanorods by changing the synthesis conditions.

Additional indication of CdSe/CdZnS alloy formation is the change in the width of the NR's without a red shift of the emission wavelength. CdZnS alloy possesses a higher band gap than CdS based nanoparticle, as shown in FIG. 1. Therefore, the emission wavelength of the seeded rod is even expected to be blue shifted in the case of CdZnS alloy nanorod compared to regular CdS nanorod. The blue shift of the photoluminescence maximum indicates the formation of CdZnS alloy, having a larger band gap than CdS nanorods, enhancing the exciton confinement and causing the blue shift of the photoluminescence central wavelength (CWL). The difference in thickness is exemplified in the TEM images in FIG. 2, comparing NR's with similar emission wavelength (540-543 nm), but prepared without Zn addition (a) or with Zn addition (b).

Figure 5:
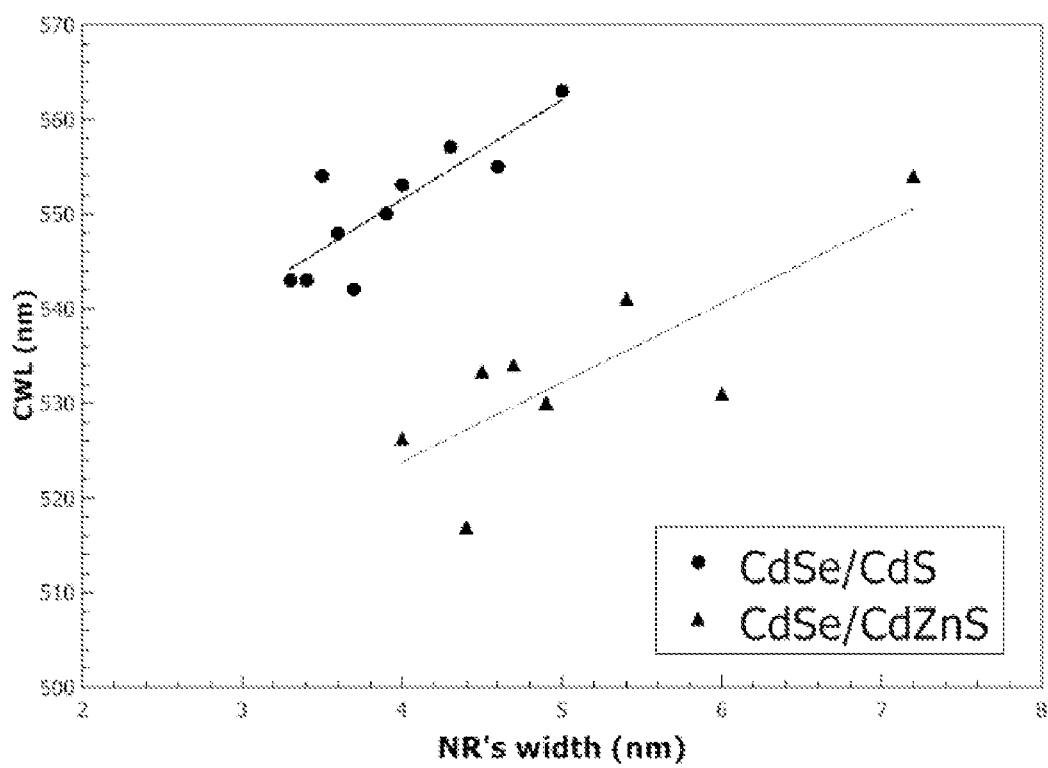
FIG. 5: Central emission wavelength plotted against nanorods width for nanorods prepared without Zn addition (circles) and with Zn addition (triangles), using the same CdSe seeds.

While the length of the NR's is similar—around 20 nm, the width of the NR's prepared without Zn is 3.7 nm, smaller compared to the NR's prepared with Zn addition, with a width of 5 nm. This behavior is demonstrated further in FIG. 5, where the emission wavelength of the NR's prepared with Zn addition is plotted versus their average width measured with TEM (black triangles), and compared to the emission wavelength of NR's prepared without Zn addition (black squares). For a given width, the NR's prepared with Zn addition, have a lower emission wavelength, in comparison to NR's prepared without Zn addition. For example NR's prepared without Zn and have a width of 4-4.5 nm, emit around 550-560 nm. In contrast, NR's prepared with the same seeds and with Zn and have a similar width of 4-4.5 nm, but emit around 530 nm, significantly blue shifted compared to the above case without Zn.

Figure 6A:
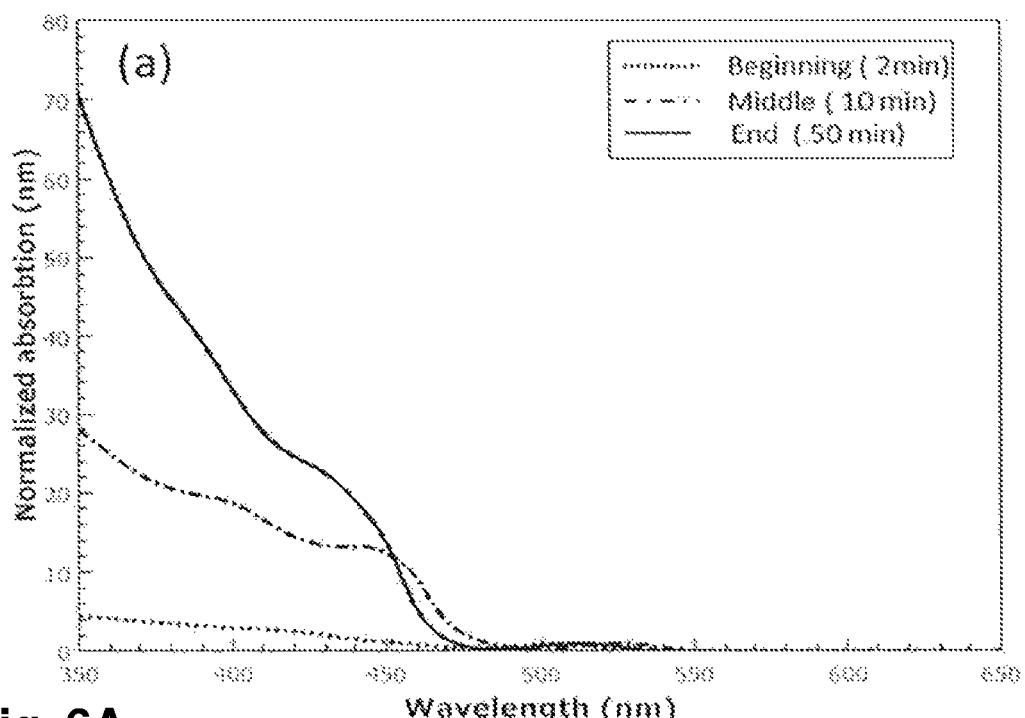
FIGS. 6A-B: Absorption (FIG. 6A) and emission (FIG. 6B) spectra of the formed nanorods. The different curves represent different stages of the reaction—Beginning of the reaction, dotted line; middle of the reaction, dash-dotted line; and the end of the reaction, solid line.
Figure 6B:
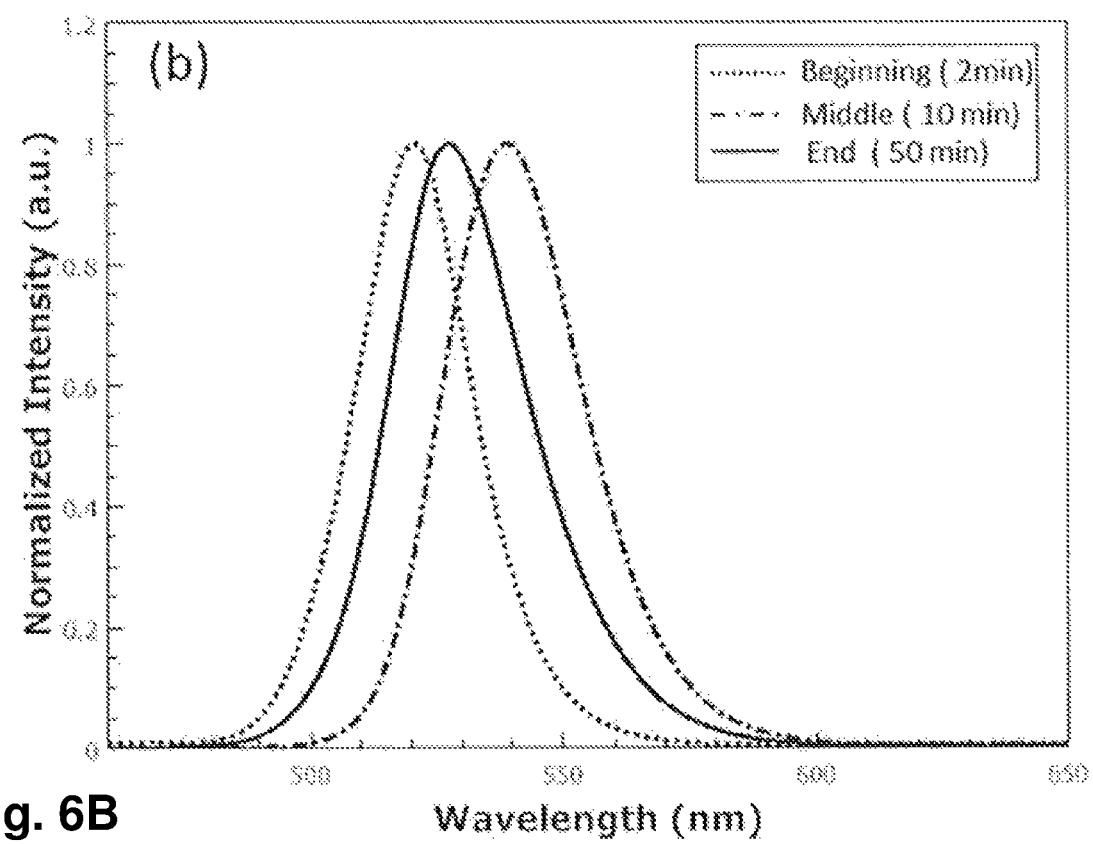

These characteristics are further demonstrated in the absorption and the emission spectrum of the nanorods which changes during their growth, as shown in FIG. 6. The absorbance of the nanorods (for λ<450 nm), normalized to the CdSe core absorption, FIG. 6A, increases during the synthesis progression, indicating the growth of the nanorod, while the onset of the large rise in nanorods absorbance is blue shifted throughout the reaction (solid line compared to dotted line). This behavior is indicative of Zn incorporation in the rod, due to the increased band gap of CdZnS compared to CdS, which should cause blue shift of the absorbance.

Furthermore, the emission maximum of the obtained nanorods also changes during the progression of the reaction. In the first stages of the reaction, the emission CWL is at 521 nm (dotted line), indicating that only a thin shell is formed. During the reaction progression, the emission CWL initially red-shifts to 540 nm (dash-dotted line), due to the growth of the nanorod. Addition of the Zn precursor and increased temperature lead to blue shift of the NR's emission to λ=530 nm in the final stages of the growth (solid line). This behavior indicates directly the formation of an alloyed shell structure with significant Zn content.

Figure 7:
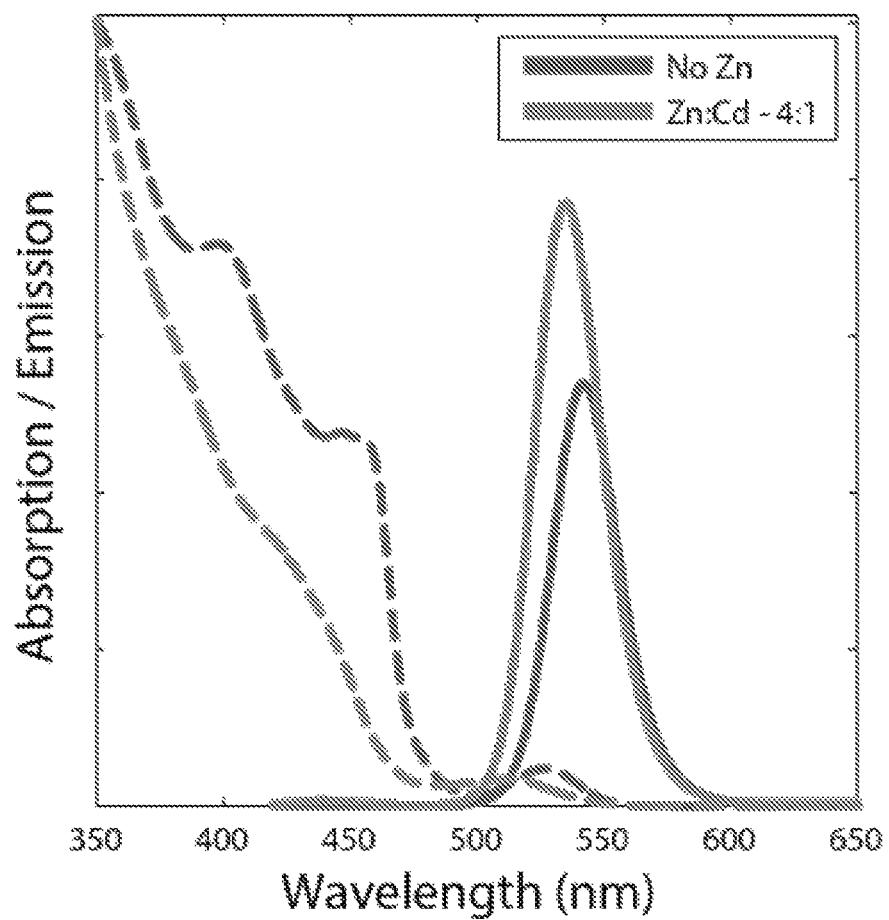
FIG. 7: Absorption (dashed) and Emission (solid) spectra of green emitting CdSe/CdS nanorods with Zn:Cd ratio of 4:1 (green), and without Zn (blue). The absorption onset is blue shifted for the Zn containing sample (408 nm=3.05 eV) in compare to the CdSe/CdS sample (458 nm=2.7 eV). The intensity of the emission peak represents the relative QY of each sample -QY=0.77 for the Zn Containing sample and QY=0.54 for the sample without Zn.

Significantly changed and improved optical properties are seen for the new CdSe/CdZnS rods invented rods over the previously known CdSe/CdS rods. This is further exemplified by detailed comparison of the optical spectroscopic properties of the CdSe/CdS rods of this example, with those of CdSe/CdZnS rods with in-synthesis ratio of Zn:Cd of 4:1 (indicated below as 4:1 rods sample) of this example. FIG. 7 presents the absorption and emission spectra of the compared samples. As already discussed above, the presence of the Zn, leads to the somewhat blue shifted rise in the absorption spectra of the rods from ~470 nm in the CdSe/CdS rods, to ~450 nm in the 4:1 rods sample. This is also accompanied by a blue shift of the fluorescence peak from 542 nm in the CdSe/CdS rods, to 535 nm in the 4:1 sample.

The ability to shift the green emission peak position is of importance for use in light conversion layers and applications of these rods in flat panel display technology and LED displays for precise improved color gamut. Most notably, the fluorescence quantum yield of the known CdSe/CdS rods sample was 54%, while the 4:1 sample has a significantly higher fluorescence Quantum Yield of 77%.

Further significant useful improvements in the optical and fluorescence properties of the new nanorods are exemplified also by comparative single nanorods fluorescence studies of these two abovementioned samples. For these optical studies of single nanorods, we spin coated a dilute solution sample of either of the nanorods samples on microscope cover slips which were precleaned thoroughly. This was done while comparing the CdSe/CdS rods without the Zn, with those with Zn:Cd ratio of 4:1. The samples were prepared in conditions allowing optical study of single nanorods using far field optical microscopy and spectroscopy, meaning that the average distance between single nanorods was much greater than the optical diffraction limit (that is, surface density well below 1 nanorods/μm). The microscope cover slips with samples were mounted on an inverted optical microscope (Nikon eclipse Ti, X100 oil immersion objective N.A=1.4), excited using LED lamp (405 nm), and the emission was measured using an EMCCD detector (Andor iXon3).

First, a comparison of single rods polarizations of either samples was performed. Highly polarized emission is desired for different applications, for example those including flat panel displays conversion layers. For these polarization studies on single rods, a polarizing beam displacer was introduced at the emission path in order to measure simultaneously both perpendicular polarization components (so called $I_V$ for vertical, and $I_H$ for horizontal emission polarization components). In addition, the emission polarization was controllably rotated by a half wave plate in order to find the maximum polarization for each single nanorod. Upon measurements in this manner, the emission polarization orientation direction and the polarization degree of each single nanorod is thus measured and found. The polarization degree is defined by the formula:

$$r = \frac{I_V - I_H}{I_V + I_H}$$

Figure 8A:
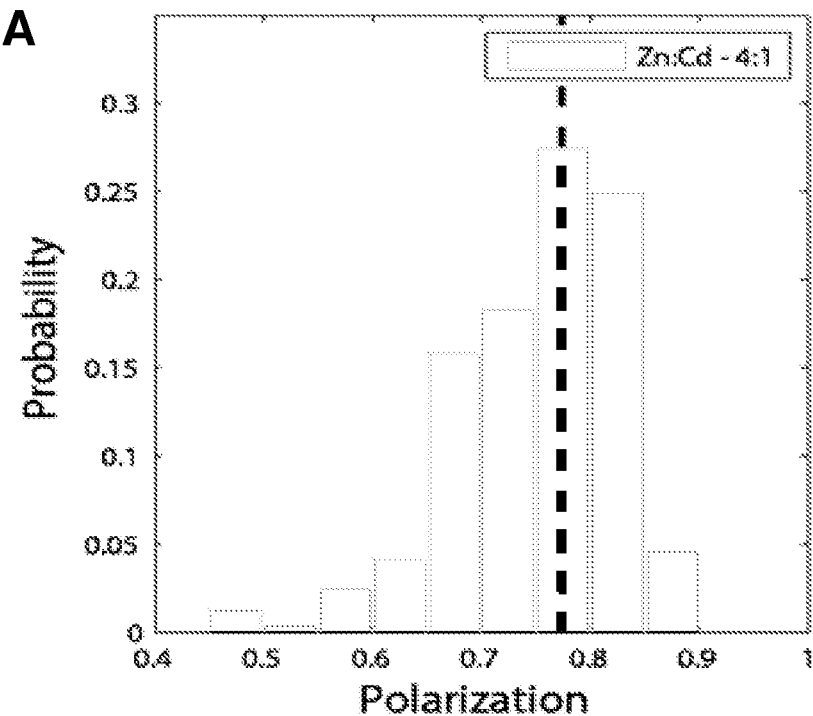
FIGS. 8(a)-(b): single nanorod emission polarization distribution of green emitting CdSe/CdS nanorods with Zn:Cd ratio of 4:1 (a), and without Zn (b). The higher polarization for the Zn containing nanorods can be seen from these histograms.
Figure 8B:
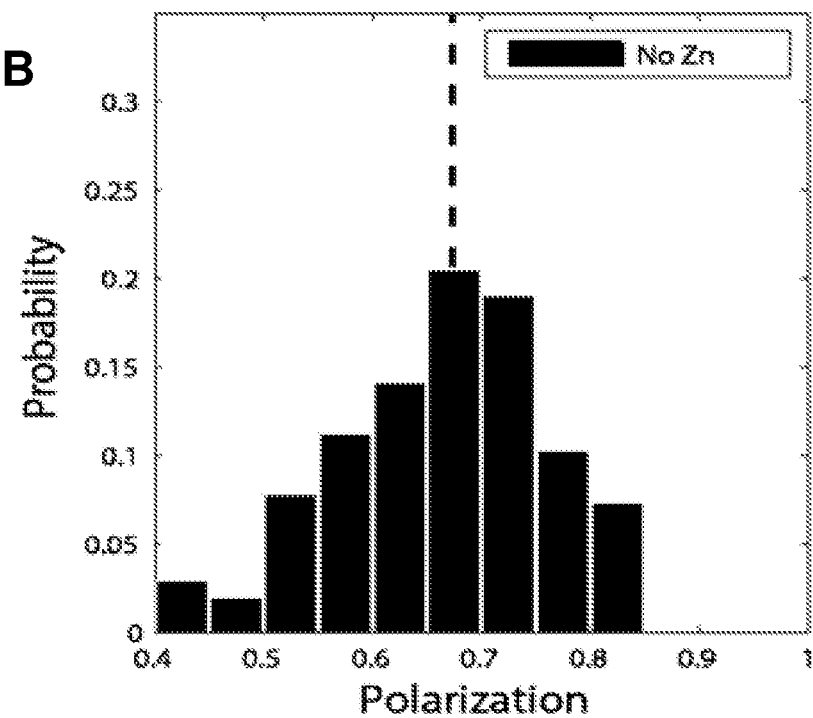

To obtain statistically significant data, we measured few hundreds of single nanorods from each sample and the polarization distribution is shown at FIG. 8A. These distributions clearly show the higher degree polarization of the Zn containing sample. This can be directly observed also from the average polarization for each sample that was calculated as well. It is found to be 0.67 for the CdS/CdS rods without Zn, and significantly increased to 0.77 for the 4:1 Zn containing rods sample. This change is directly linked to the compositional control uniquely achieved in the new CdSe/CdZnS rods invented herein.

For the same samples we also measured and compared the fluorescence blinking behavior of single nanorods. An ideal nanorod would not blink off, while increased on-off blinking has a negative influence on the optical properties in light emission applications. For this study we removed all the polarizing components from the optical path, and measured the sample at a high frame rate of the camera of (~200 Hz=4 ms integration time). From these measurements, we extract the count rate of single nanorods at each frame, and build an emission time trajectory for each single nanorod. From each time trajectory we extracted the ON/OFF ratio, and the duration of the ON and OFF states for this specific nanorod.

Figure 9:
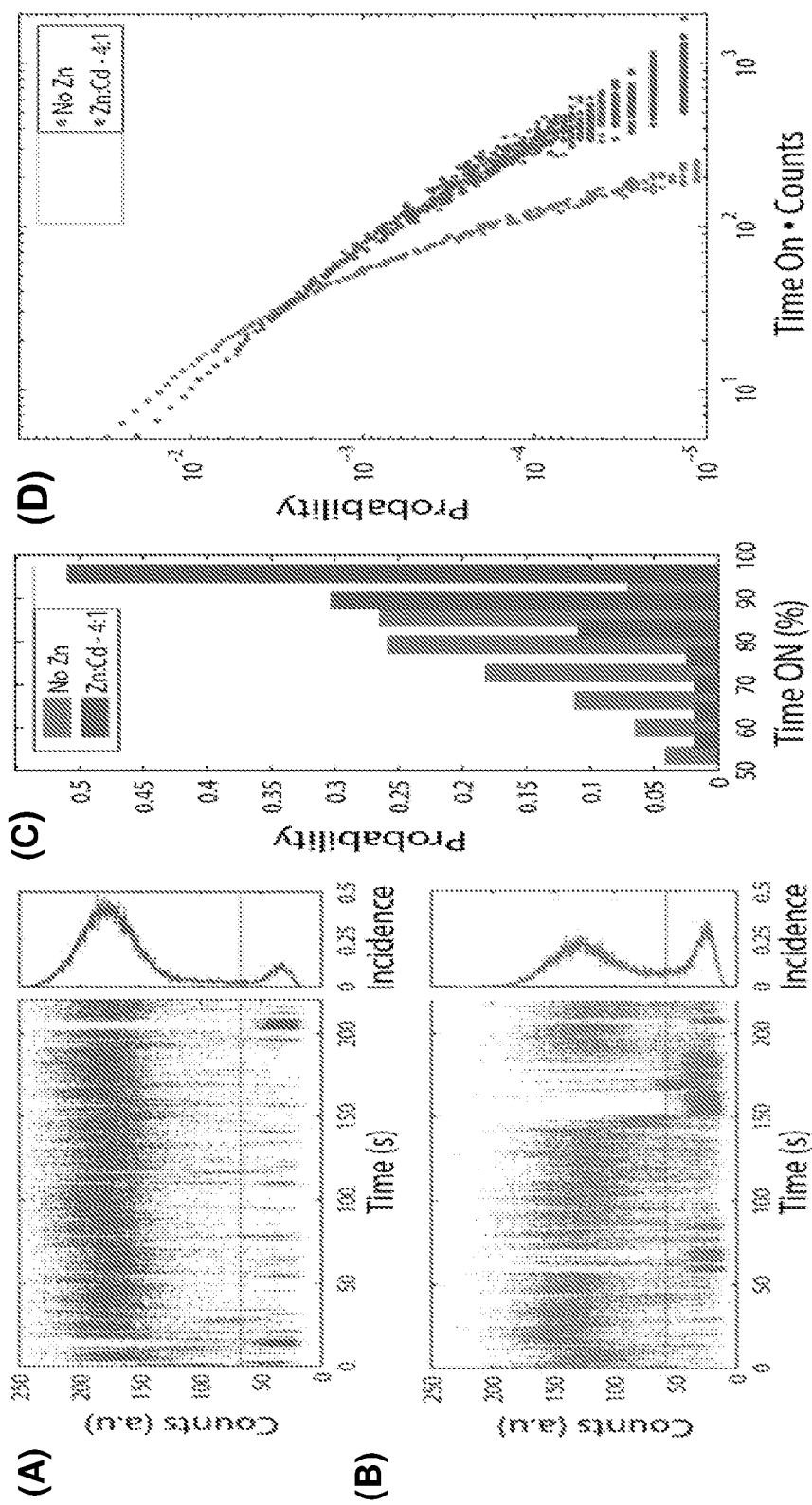
FIGS. 9(a)-(d): Blinking analysis of green emitting nanorods without Zn (blue) and with Zn:Cd ratio of 4:1 (green). (a), (b), shows emission time trajectories of single nanorods with and without Zn respectively, the red line represent the transition between ON and OFF states. The reduced blinking of the Zn containing NRs can be clearly seen already from these trajectories. (c), (d) shows statistical results obtained from measurements of hundreds of single nanorods of the same samples. (c) Average Time ON distribution. (d) Time ON*Counts plot. Both plots emphasize the greatly reduced blinking of the Zn containing nanorods.

Representative time trajectories for the nanorods, with and without Zn, are shown at FIGS. 9(*a*) and (*b*), respectively. In general, the Zn containing nanorods showed significantly suppressed blinking behavior, that is they remained in the on state for longer times and much less frequently departed it into an off-state. The greatly improved behavior of the 4:1 Zn containing rods is clearly exemplified statistically in FIG. 9 (*c*), which shows the average time ON distribution for both samples. This is a measure of the ON/OFF ratio in each case. It is clearly seen that for the 4:1 Zn containing rods we see a much increased probabilities for on-states, compared with CdSe/CdS rods sample without Zn. Accordingly, for the Zn containing nanorods, the average time ON was found to be 87%, while for the nanorods without Zn the average was only 75%, this again shows the significantly suppressed fluorescence blinking of the new invented Zn containing nanorods. Moreover, a more detailed representation that shows the Zn containing nanorods has lower probability to transfer from ON to OFF states is presented at FIG. 9 (*d*). This plot shows the (Time ON*Counts) distribution, which is the average photons that a nanorod emits at a specific ON state prior to its transition to an OFF state. If this number is high, it means that the probability of the nanorod to enter an OFF state upon excitation is low. So in summary, we clearly prove significantly reduced fluorescence blinking for the new nanorods with Zn content.

Example 1B—CdSe/Cd$_x$Zn$_{1-x}$S Nanorod with Large Seeds (3.5 nm)

$1.9 \times 10^{-3}$ mole CdO, Hexylphosphonic acid (HPA) and octadecylphosphonic (ODPA) in a 4:1 ratio to CdO were added to a 3 neck flask containing trioctylphosphine oxide (TOPO) and evacuated at 150° C. for 1.5 hrs. The flask was heated under Argon to 300° C. and was held in this temperature until the solution was clear. Then, trioctylphosphine (TOP) was added drop wise to the flask. Afterwards, the temperature in the flask was raised to 360° C., where the solution of CdSe cores in Sulfur-TOP were swiftly injected into the flask. During the first 10 min of the synthesis, 20 ml of Zn oleate were added to the flask. The reaction was terminated after 1 hour, cooled down to room temperature and its content stored under argon.

Figure 10A:
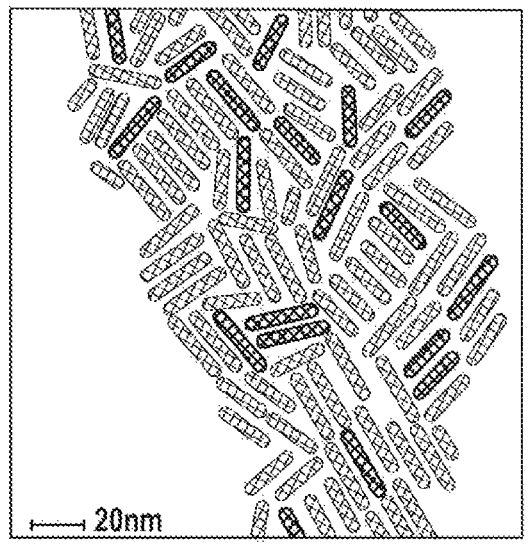
FIGS. 10A-B: TEM of red emitting nanorods prepared with Zn:Cd ratio in the rod growth reaction of 4:1 (FIG. 7A) and 8:1 (FIG. 7B).
Figure 10B:
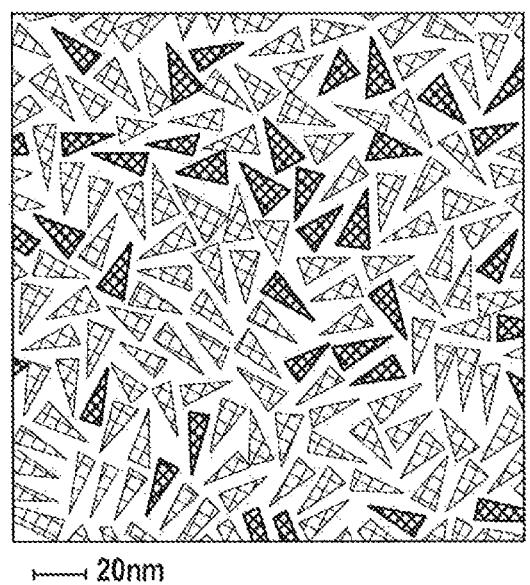
Figure 11A:
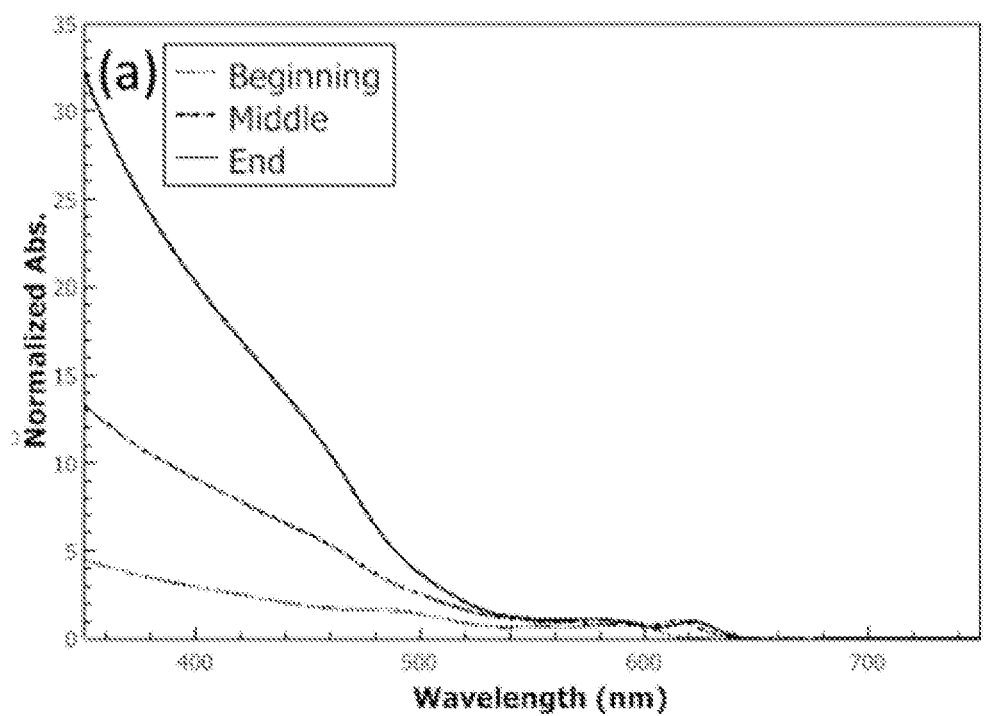
FIGS. 11A-B: Normalized absorption (FIG. 8A) and photoluminescence (FIG. 8B) spectrum of $CdSe/Cd_xZn_{1-x}S$ nanorods prepared with larger (3.5 nm) CdSe seeds.
Figure 11B:
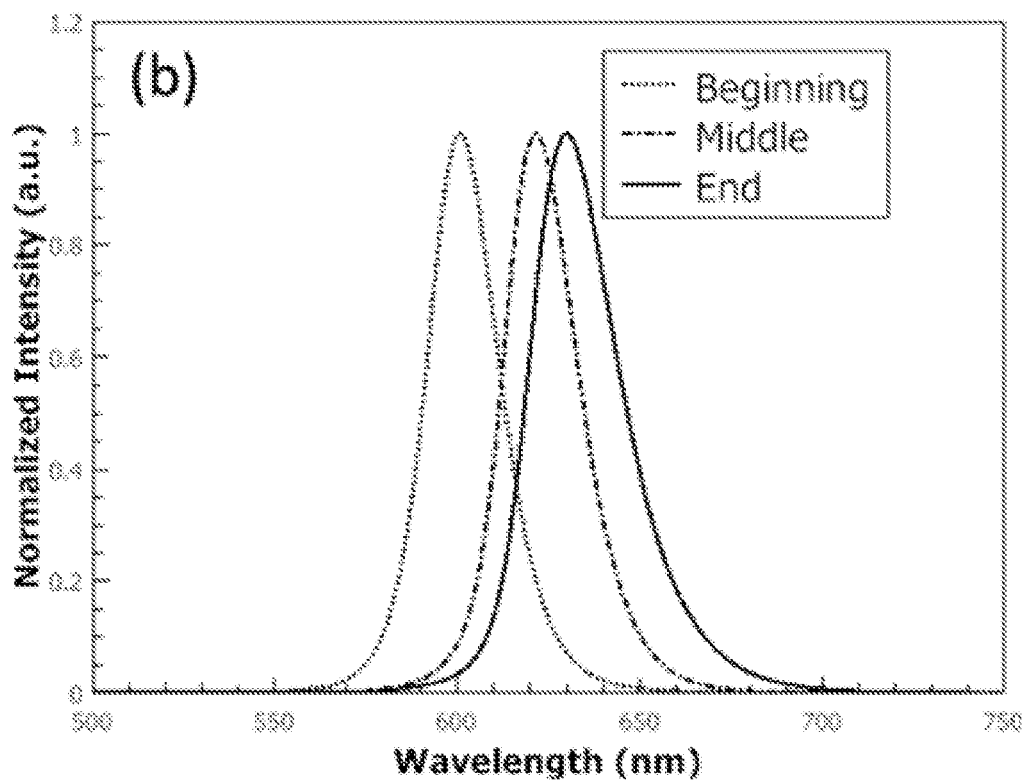

This example is similar to example 1A, but bigger CdSe seeds—approx. 3.5 nm in diameter, are injected into the flask resulting in a red emitting nanorods. The TEM images of the resultant nanorods is presented in FIG. 10, showing a rod-like structure for NR's obtained with 4:1 and 8:1 Zn:Cd ratio in FIG. 10A and FIG. 10B, respectively. The Zn/Cd ratio in the nanorods synthesized with 4:1 Zn/Cd ratio is approx. 0.6. The spectral progression during the synthesis of these rods is presented in FIG. 11 Similarly to the behavior in example 1A, the absorption in the lower wavelengths region increases, during the synthesis, indicative of increasing Zn content in the nanorod. The photoluminescence spectrum of the nanorods red shifts throughout the synthesis. This shift directly indicates incorporation of Zn in the rods during synthesis and the rods growth.

Example 1C—CdSe/Cd$_x$Zn$_{1-x}$S Nanorod Prepared after the Synthesis

In this case the formation of the alloy nanorod occurs after the synthesis of CdSe/CdS nanorods, which are washed to get rid of excess ligands and precursors. Afterwards, the nanorods are dissolved in TOP/TOPO mixture and an excess of a reactive Zn-precursor (amount equivalent to 10 monolayers of ZnS) is added to the flask in elevated temperatures (200° C.) and held in this temperature for 2 hrs.

Example 1D—CdSe/ZnS Nanorods

Figure 12:
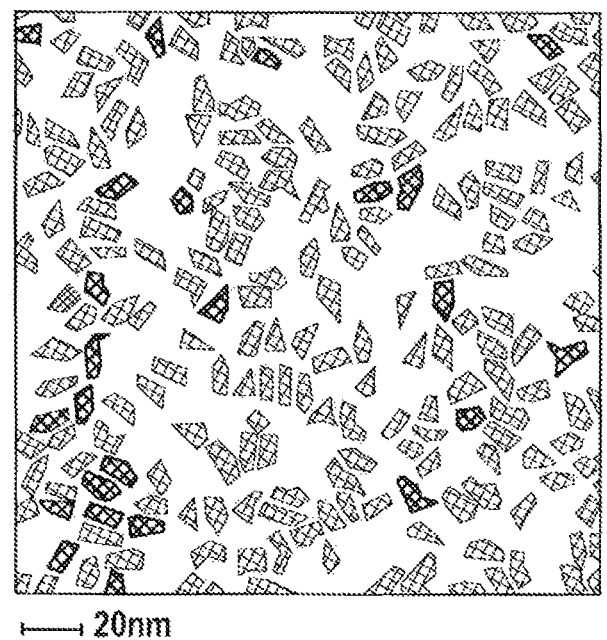
FIG. 12: TEM image of CdSe/ZnS with a rod like structure.

In this example there is only Zn in the rod without Cd. No Cd is added to the flask in the beginning of the synthesis. In order to facilitate the nanorods growth in this case, and prevent the decomposition of the seeds, a small amount of Zn precursor is injected together with the CdSe seeds and the sulfur precursor. The product of the synthesis is a rod like structure, as seen in FIG. 12 showing the TEM image. Furthermore, its crystalline structure bears a strong resemblance to the pattern of wurtzite ZnS, as presented in FIG. 3, upper curve, compared to the top panel.

Example 2

In this example seeds other than CdSe dots are injected to the solution, demonstrating control over the composition of the seeded rod.

Example 2A—ZnSe/Cd$_x$Zn$_{1-x}$S Nanorod

In this example small ZnSe nanocrystals seeds are injected to the flask containing CdO, phosphonic acids and TOP/TOPO mixture. The small lattice mismatch between ZnSe and CdS and (2-5%) allows the growth of CdS rods, as shown by previously Addition of Zn precursor to the synthesis, as described in example 1A, leads to ZnSe/Cd$_x$Zn$_{1-x}$S nanorod with controlled composition.

Example 2B—InP@ZnSe/Cd$_x$Zn$_{1-x}$S

Further control over nanorods composition and hence properties could be obtained when InP/ZnSe core/shells seeds, or In/ZnSeS seeds, or InP/ZnSe/ZnS seeds, synthesized in accordance with U.S. Pat. No. 7,964,278 and with U.S. Pat. No. 8,343,576, are injected to the flask containing CdO, phosphonic acids and TOP/TOPO mixture. The small lattice mismatch between ZnSe and CdS and (2-5%) allows the growth of CdS rods. Addition of Zn precursor to the synthesis, as described in detail example 1A, leads to InP@ZnSe/Cd$_x$Zn$_1$-xS nanorods with controlled composition and controlled optical properties governed by the size of InP@ZnSe seed.

Example 3—CdSe/Cd$_x$Zn$_{1-x}$Se$_y$S$_{1-y}$ Nanorods

In this case a quaternary alloyed seeded rod is obtained, by introducing two anions in addition to two cations to the reaction as presented in the previous examples. The synthesis is similar to the syntheses described, differing in that there is also addition of Se precursor together with S precursor to the flask. Changing the relative amount of Se, S, Zn and Cd in the synthesis can allow controlling the composition of the seeded rod.

The invention claimed is:

1. A polarized light emitting seeded nanorod comprising a zinc-chalcogenide rod nanostructure embedding a seed nanostructure of a different material, wherein the zinc-chalcogenide rod is of a material having the general formula Cd$_x$Zn$_{1-x}$Se$_y$S$_{1-y}$, where x is between 0.5 and 0.9, and wherein y is from 0 and 1, wherein the zinc-chalcogenide is graded within the cadmium chalcogenide such that the amount (concentration) of cadmium chalcogenide increases away from the seed structure, and wherein said seeded nanorod is not a core-shell structure and said seeded nanorod is capable of emitting polarized light.

2. The seeded nanorod according to claim 1, wherein the Zn-chalcogenide rod nanostructure further comprises at least one other material.

3. The seeded nanorod according to claim 2, wherein the at least one other material is selected amongst metals, metal alloys, metal oxides, insulators, and semiconducting materials.

4. The seeded nanorod according to claim 3, wherein the at least one other material is or comprises an element of Groups IIIB, IVB, VB, VIB, VIIB, VIIIB, IB, IIB, IIIA, IVA and VA of block d of the Periodic Table of the Elements.

5. The seeded nanorod according to claim 3, wherein the at least one other material is or comprises a metal selected from Sc, Ti, V, Cr, Mn, Fe, Ni, Cu, Y, Zr, Nb, Tc, Ru, Mo, Rh, W, Au, Pt, Pd, Ag, Mn, Co, Cd, Hf, Ta, Re, Os, Ir and Hg.

6. The seeded nanorod according to claim 3, wherein the seed material and the at least one other material are each, independently of each other, a semiconductor material selected from elements of Group I-VII, Group II-VI, Group III-V, Group IV-VI, Group and Group IV semiconductors and combinations thereof.

7. The seeded nanorod according to claim 6, wherein the semiconductor material is selected from CdSe, CdS, CdTe, HgS, HgSe, HgTe, CdSeTe and any combination thereof.

8. The seeded nanorod according to claim 6, wherein the semiconductor material is selected from ZnSe, ZnTe, ZnS, ZnCdSe, ZnCdTe, ZnCdS and any combination thereof.

9. The seeded nanorod according to claim 6, wherein the Group III-V material is selected from InAs, InP, InN, GaN, InSb, InAsP, InGaAs, GaAs, GaP, GaSb, AlP, AlN, AlAs, AlSb and any combination thereof.

10. The seeded nanorod according to claim 6, wherein the Group IV-VI material being selected from PbSe, PbTe, PbS, PbSnTe, Tl$_2$SnTe$_5$ and any combination thereof.

11. The seeded nanorod according to claim 1, being between about 5 nm and 150 nm in length and between about 2 and 15 nm in width (thickness).

12. The seeded nanorod according to claim 1, having an aspect ratio (length/thickness) between 1.8 and 20.

13. A device incorporating at least one seeded nanorod according to claim 1.

14. The device according to claim 13, selected from a light conversion layer, a back light unit of a flat panel display, a laser, an optical switch, an optical fiber, a gain device, an amplifier, a display device, a detector, a communication system, a light emitting diode, a solar cell, a fluorescent marker, a fluorescent biomarker and a sensor.

15. A light emitting diode comprising a seeded nanorod according to claim 1.

16. A process for the manufacture of a seeded nanorod according to claim 1, the process comprising treating a medium containing seed nanocrystals with (1) a chalcogenide precursor and a metal atom containing precursor under conditions initiating formation of a metal-chalcogenide nanorod around the seed nanocrystals; and (2) at least one zinc atom containing precursor to thereby provide the seeded nanorod as defined in claim 1.

17. A process for the manufacture of a seeded nanorod according to claim 1, the process comprising treating a medium containing seed nanocrystals with (1) a chalcogenide precursor and a metal atom containing precursor under conditions initiating formation of a metal-chalcogenide nanorod around the seed nanocrystals; and (2) at least one zinc atom containing precursor to thereby provide the seeded nanorod, wherein the seeded nanorod being of the formula seed/metal$_x$Zn$_{1-x}$chalcogenide$_y$, wherein the metal is Cd, the chalcogenide is selected from S and Se, and each of x and y independently is as defined in claim 1.

18. The process according to claim 17, comprising adding to a medium containing seed nanocrystal a chalcogenide precursor and a metal precursor under conditions initiating formation of a metal-chalcogenide nanorod around the seed nanocrystals; and subsequently adding at least one zinc precursor.

19. The process according to claim 17, wherein the metal precursor and the zinc precursor are added simultaneously or step-wise.

20. The process according to claim 17, wherein the metal chalcogenide rod formation is carried out at a temperature between 100 and 380° C.

21. The process according to claim 17, wherein the metal chalcogenide rod formation is carried out at a temperature between 320 and 380° C.

22. The process according to claim 17, wherein, independently of the temperature under which the metal chalcogenide rod is formed, the zinc precursor is added to the medium at a medium temperature between 200 and 380° C.

23. The process according to claim 22, wherein the zinc precursor is added at a temperature between 320 and 380° C.

24. A seeded nanorod selected from:
CdSe/Cd$_x$Zn$_{1-x}$S, wherein x is between 0 and 1;
CdSe/ZnS;
CdSe/CdZnS;
ZnSe/Cd$_x$Zn$_{1-x}$S, wherein x is between 0 and 1;
InP@ZnSe/Cd$_x$Zn$_{1-x}$S, wherein x is between 0 and 1;
CdSe/Cd$_x$Zn$_{1-x}$Se$_y$S$_{1-y}$, wherein x is between 0 and 1 and wherein y is between 0 and 1;
CdS/Cd$_x$Zn$_{1-x}$S, wherein x is between 0 and 1; CdS/Cd$_x$Zn$_{1-x}$Se, wherein x is between 0 and 1;
ZnS/Cd$_x$Zn$_{1-x}$S, wherein x is between 0 and 1;
ZnS/Cd$_x$Zn$_{1-x}$Se, wherein x is between 0 and 1;
InP@ZnS/Cd$_x$Zn$_{1-x}$S, wherein x is between 0 and 1;
InP@ZnS/Cd$_x$Zn$_{1-x}$Se, wherein x is between 0 and 1;
InP@ZnSe/Cd$_x$Zn$_{1-x}$Se, wherein x is between 0 and 1; and
CdS/Cd$_x$Zn$_{1-x}$Se$_y$S$_{1-y}$, wherein x is between 0 and 1 and wherein y is between 0 and 1.

\* \* \* \* \*

UNITED STATES PATENT AND TRADEMARK OFFICE
CERTIFICATE OF CORRECTION

PATENT NO. : 10,723,941 B2
APPLICATION NO. : 15/576912
DATED : July 28, 2020
INVENTOR(S) : Banin et al.

It is certified that error appears in the above-identified patent and that said Letters Patent is hereby corrected as shown below:

In the Claims

Column 16, Line 28:
Change "Group IV-VI, Group and Group IV" to --Group IV-VI, Group III-VI, and Group IV--.

Signed and Sealed this
Tenth Day of November, 2020

Andrei Iancu
*Director of the United States Patent and Trademark Office*